United States Patent

Gaultier et al.

[11] Patent Number: 5,581,511
[45] Date of Patent: *Dec. 3, 1996

[54] INTEGRATED CIRCUIT MEMORY DEVICE WITH BALANCING CIRCUIT INCLUDING FOLLOWER AMPLIFIER COUPLED TO BIT LINE

[75] Inventors: Jean-Marie Gaultier, Rousset sur Arc; Emilio M. Yero, Aix en Provence, both of France

[73] Assignee: SGS-Thomson Microelectonics S.A., Pouilly, France

[ * ] Notice: The term of this patent shall not extend beyond the expiration date of Pat. No. 5,432,746.

[21] Appl. No.: 96,684

[22] Filed: Jul. 23, 1993

[30] Foreign Application Priority Data

Jul. 24, 1992 [FR] France .................................. 92 09199

[51] Int. Cl.⁶ .................................................. G11C 7/00
[52] U.S. Cl. ............................ 365/202; 365/207; 365/203; 365/189.07; 365/210; 327/53; 327/54; 327/56
[58] Field of Search ............................ 365/189.01, 203, 365/202, 207, 210, 185, 189.05, 189.07, 185.2, 185.25; 307/530; 327/52, 53, 54, 56

[56] References Cited

U.S. PATENT DOCUMENTS

| | | | |
|---|---|---|---|
| 4,598,389 | 7/1986 | Duvvury et al. | 365/208 |
| 4,851,894 | 7/1989 | de Ferron et al. | 357/52 |
| 4,903,241 | 2/1990 | Boudewijns | 365/194 |
| 4,947,375 | 8/1990 | Gaultier et al. | 365/200 |
| 5,007,026 | 4/1991 | Gaultier et al. | 365/201 |
| 5,027,003 | 6/1991 | Haight et al. | 307/242 |
| 5,058,069 | 10/1991 | Gaultier et al. | 365/200 |
| 5,189,322 | 2/1993 | Chan et al. | 307/530 |
| 5,204,838 | 4/1993 | Son et al. | 365/203 |
| 5,289,420 | 2/1994 | Neu | 365/203 |
| 5,432,746 | 7/1995 | Guedj | 365/202 |

FOREIGN PATENT DOCUMENTS

| | | |
|---|---|---|
| 0264933 | 4/1988 | European Pat. Off. . |
| 0412837 | 2/1991 | European Pat. Off. . |
| 0488893 | 6/1992 | European Pat. Off. . |

OTHER PUBLICATIONS

IEEE Journal of Solid-State Circuits, vol. 23, No. 5, Oct. 1988, New York, US, pp. 1150–1156, Gastaldi et al., "A 1-Mbit CMOS EPROM with Enhanced Verification".

Primary Examiner—David C. Nelms
Assistant Examiner—Andrew Q. Tran
Attorney, Agent, or Firm—David M. Driscoll; James H. Morris; Brett N. Dorny

[57] ABSTRACT

In reading circuits for memories in integrated circuit form, notably non-volatile memories, to obtain a better compromise between reading speed and the reliability of the information read, there is proposed a reading circuit. A differential amplifier for reading a memory cell is connected to a precharged bit line and reference line. A follower amplifier balances the input potentials of the differential amplifier before the reading phase. The follower amplifier has one input connected to the output of the differential amplifier and is connected during the balancing phase in such a way that it injects a load current to the- bit line in a direction tending to cancel the output voltage of the differential amplifier. A cascode transistor can be used to accelerate the reading.

11 Claims, 2 Drawing Sheets

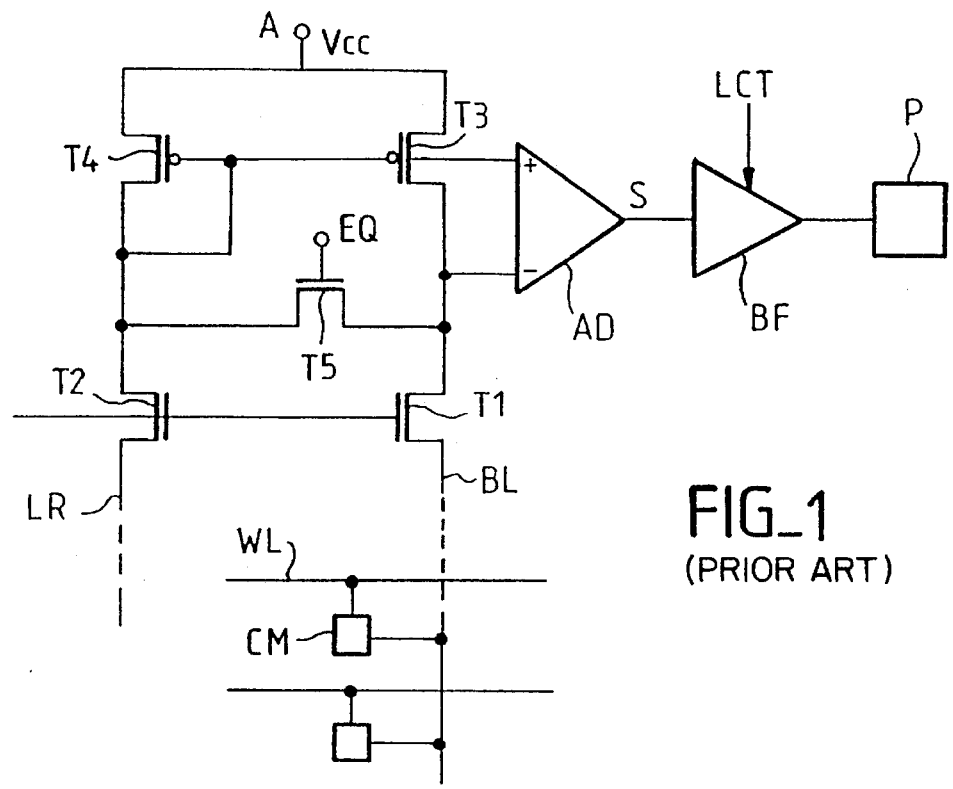
FIG_1
(PRIOR ART)
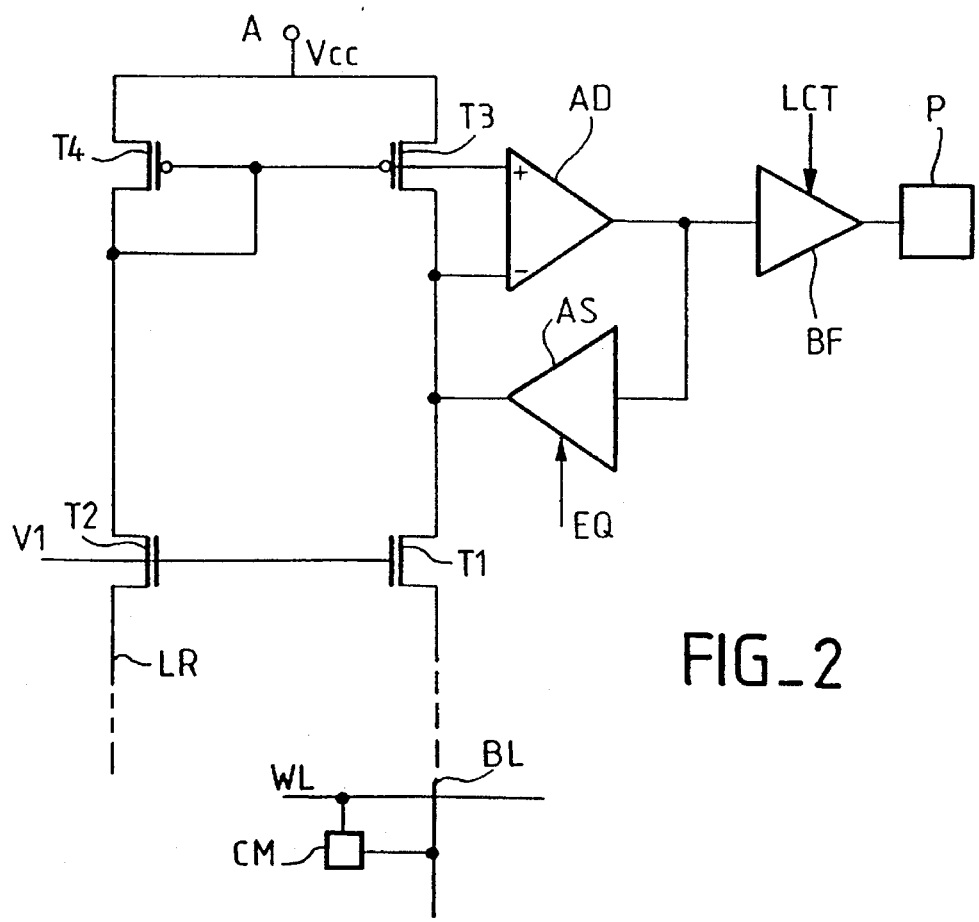
FIG_2

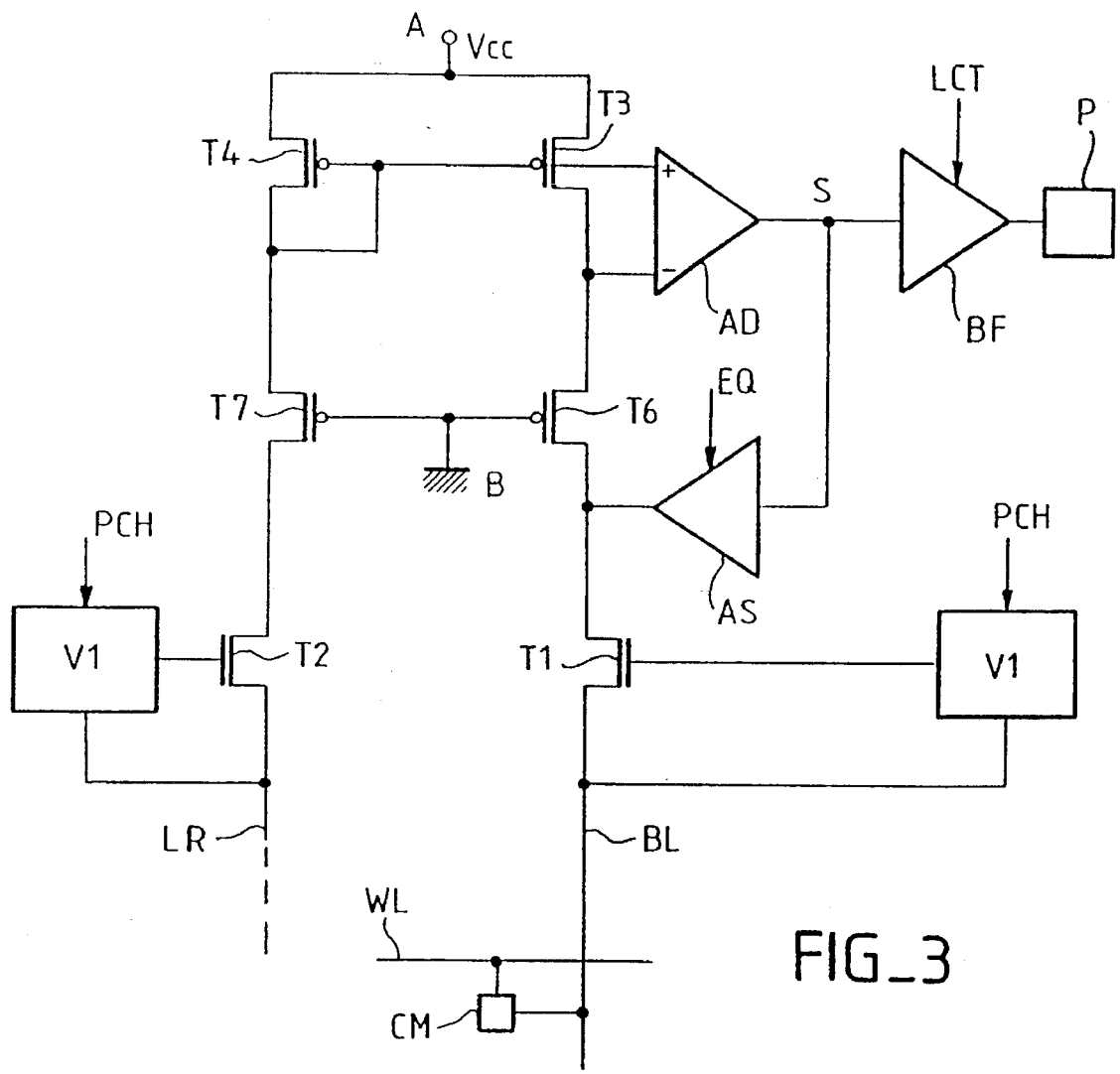
FIG_3

INTEGRATED CIRCUIT MEMORY DEVICE WITH BALANCING CIRCUIT INCLUDING FOLLOWER AMPLIFIER COUPLED TO BIT LINE

BACKGROUND OF THE INVENTION

1. Field of the Invention

The invention relates to memories in integrated circuit form, and more particularly to reading circuits that can be used to detect the state of the cells of the memory.

The invention shall be described with reference to electrically programmable non-volatile memories (EEPROM, EPROM, flash EPROM) although it is applicable to other types of memories, both volatile and non-volatile.

The memories are organized in networks of cells, the cells of a same column being connected to a bit line, and the cells of a same row being connected to a word line. The bit line enables the transmission of an information element on the state of a memory cell located at the intersection of this bit line and a selected word line.

The reading circuits are connected to bit lines, possibly by means of a multiplexer if there are several bit lines for one reading circuit. Hereinafter, we shall consider a single reading circuit, assumed to be connected to a single bit line, in order to simplify the explanations.

2. Description of the Prior Art

The general principle of a reading circuit is shown in FIG. 1, and its operation shall be explained hereinafter. It is assumed that the memory is an EEPROM memory, it being possible for the cells to have a blank state in which they let through an electrical current, and a programmed state in which they counter the passage of the current. To read the information, it is sought to detect the presence of a load current or discharge current of the bit line connected to the cell to be read. A current such as this exists if the cell is blank, while it does not exist if the cell is programmed.

To detect the current, a reference line similar to the bit line is used, so as to work in differential mode. The reference line conducts a reference current during the reading phase. In a precharging phase prior to the reading phase, the bit line and the reference line are precharged to a potential that may be of the order of 1 volt. Then the reading phase takes place, and the bit line discharge current is compared with the reference line discharge current. This makes it possible to determine whether the selected cell is blank or programmed. Preferably, a current/voltage converter is used to convert the bit line discharge current into a voltage so as to enable the use of a voltage differential amplifier to carry out the comparison.

FIG. 1 shows a simplified view of an exemplary prior art reading circuit.

A memory cell CM, located at the intersection of a word line WL and a bit line BL may be selected by the word line, and it then delivers an information element on the bit line. The bit line BL is precharged in voltage, in a precharging phase, by a precharging transistor T1 which has the function of giving a precharging current to the bit line, while restricting the precharge potential to a determined value, preferably in the region of one volt.

A reference line LR, having characteristics very similar to those of the bit line, notably from the viewpoint of the parasitic capacitances, is also precharged to a voltage value of about one volt by a precharging transistor T2. During the reading phase, this reference line consumes current equivalent to the current consumed by a blank memory cell. The reference line may be the bit line of a column of blank reference cells addressed by the same word lines as the cells to be read.

The transistors T1 and T2 are preferably N channel transistors, and their source is connected to the bit line and to the reference line respectively. To simplify the description, the gates of the transistors T1 and T2 are shown as being connected to a bias voltage source V1. The value of the voltage V1 defines the upper limit of the voltage for the precharging of the lines LR and BL.

To read the state of the cells, a comparison shall be made between the current consumed by the bit line and a reference current. More specifically, the current consumed by the bit line will be compared with a reference current which is a fraction of the current normally consumed by a blank cell.

To this end, the drains of the transistors T1 and T2 are supplied by the two arms of a current mirror with a copying ratio k that is smaller than 1. The first arm of the mirror has a copying transistor T3. The second arm has a reference transistor T4. The copying transistor tends to copy the current that flows in the reference transistor. The copying ratio k is the ratio of the geometries of the transistors, and preferably it is seen to it that the ratio k is smaller than unity, preferably ½.

The copying transistor T3 is a P channel transistor having its source connected to the high voltage supply terminal of the circuit (terminal A); this terminal is generally at a level of about +5 volts above a low voltage supply terminal. The drain of the copy transistor is connected to the drain of the first precharging transistor T1.

In the same way, the reference transistor T4 is a P channel transistor, with a greater geometry than T3, the source of which is connected to the terminal A and the drain of which is connected to the drain of the second precharging transistor T2.

The gates of the transistors T3 and T4 are joined, and the gate of the reference transistor is connected to its drain (in a diode assembly). There is therefore a standard current copying diagram.

A differential amplifier AD has its inputs connected to the drains of the transistors T3 and T4 and therefore measures the difference between the potentials at these two drains. This difference is zero if the ratio of the currents in T3 and T4 is the ratio k of the geometries. It differs from zero if the ratio of the currents differs from k. The output of the amplifier AD gives a signal which indicates whether the ratio of the currents is greater than or smaller than k.

Finally, a balancing transistor T5 is placed in order to zero-set the differential input voltage at the terminals of the differential amplifier, in a balancing phase that follows the precharging phase and precedes the reading phase. This balancing phase enables the differential voltage difference at the input of the amplifier AD to be reduced to a value that is as close as possible to zero irrespectively of the logic state read in a memory cell at the previous reading phase. The transistor T5 is, for example, an N channel transistor that is made conductive during a balancing phase EQ.

Among the qualities that are expected of a reading circuit, there are notably the obtaining of sufficient speed for the precharging, balancing and reading phases, this speed being furthermore related to the sensitivity of the reading, i.e. the capacity of the circuit to detection small variations in current.

SUMMARY OF THE INVENTION

To obtain better compromises between the imperatives of speed and of exactness of the information read, the present invention proposes to improve the reading circuit by modifying the balancing circuit and its relationship with the rest of the reading circuit.

According to the invention, there is proposed a memory in integrated circuit form, comprising at least one bit line to which memory cells are connected and a reading circuit comprising a differential amplifier, means for the precharging of the bit line before a reading phase and means for the balancing of the input potentials of the differential amplifier before the reading phase, wherein the balancing means comprise a follower amplifier that has an input connected to the output of the differential amplifier and is connected during the balancing phase in such a way that it injects a load current into the bit line in a direction tending to cancel the output voltage of the differential amplifier.

In other words, what the balancing phase uses is not a simple short circuit between the inputs of the differential amplifier, to balance the precharging of the bit line and the precharging of the reference line in order to have a zero differential voltage at the input of the differential amplifier, but a negative feedback between the output of the amplifier and one of the inputs, this negative feedback acting on the precharging of the bit line.

In general, there will be a reference line similar to the bit line, a first bit line precharging transistor, a second reference line precharging transistor, and the output of the follower amplifier will be connected during the balancing phase to the first precharging transistor.

In principle, the bit line and the reference line are connected to current comparison means enabling the comparison, during the reading phase, of the bit line discharging current and the reference line discharging current. These comparison means may use a current mirror having a copying ratio different from unity, with a reference transistor and a copying transistor.

In this case, it is desirable to provide for a first intermediate transistor that has its gate connected to a fixed potential and is series connected between the copying transistor and the first precharging transistor, and a second intermediate transistor that has its gate connected to the same potential as the first one, in series between the reference transistor and the second precharging transistor. These intermediate transistors are cascode-connected with their gate at constant potential, and they are used to increase the dynamic resistance of the arms of the current mirror, so as to accelerate the detection of a current variation in the arms of the current mirror.

BRIEF DESCRIPTION OF THE DRAWINGS

Other characteristics and advantages of the invention will appear from the following detailed description, made with reference to the appended drawings, of which:

FIG. 1, already described, shows a reading circuit according to a known technique;

FIG. 2 shows a reading circuit according to an embodiment of the invention;

FIG. 3 shows a reading circuit according to another embodiment.

DETAILED DESCRIPTION

FIG. 2 differs from FIG. 1 in that the balancing transistor T5 has been eliminated and a follower amplifier AS has been added, the input of this follower amplifier being connected to the output S of the differential amplifier AD and its output being connected to the drain of one of the precharging transistors, preferably the transistor T1 which is connected to the bit line corresponding to the cell to be read.

This follower amplifier AS is activated only during a balancing phase EQ preceding the reading phase LCT. During the other phases, especially during the reading phase, its output behaves like a high impedance so as to take current from the first arm of the current mirror or to inject it therein. An activation command of the follower amplifier receives a clock signal defining the balancing phase EQ.

This follower amplifier constitutes the chief element of a negative feedback loop which modifies the precharging of the bit line to increase or decrease the potential of an input of the differential amplifier AD, in a direction tending to cancel the output voltage of the differential amplifier.

The negative feedback loop therefore tends to play the role sought for the transistor T5 in FIG. 1, but in a very different way since, firstly, action is taken directly from the output of the differential amplifier and not its inputs and, secondly, action is taken by injecting or removing an additional load current of the bit line, and not by short-circuiting the bit line and the reference line.

The activation of the follower amplifier AS may be considered to act as a complementary precharging operation. It is not absolutely necessary to provide for two distinct phases (precharging and balancing) before the reading phase. A single balancing phase may be provided for, since it acts in the same way as a precharging phase while at the same time fulfilling a balancing function.

This is why the control gates of T1 and T2 are shown as being controlled by a simple fixed bias potential V1 and not by a circuit activated during a precharging phase. For example, V1=2 volts to limit the potential of the lines LR and BL to about 1 volt.

The transistors T1 and T2 act, as in FIG. 1, as voltage limiters to limit the precharging voltage of the bit line and the reference line to the region of one volt.

The circuit works as follows: during the precharging phase, the bit line and the reference line are taken to a potential of about 1 volt. The value of the voltage V1 applied during the precharging enables this potential value to be controlled. Then, during the balancing phase, the follower amplifier AS is activated and modifies the load of the bit line as a function of the state of the output of the differential amplifier. The modification of the load of the bit line tends to bring the output of the amplifier AD to zero. Thus, a balancing of the differential amplifier is obtained just before the reading phase. The output of the amplifier then gives practically a zero voltage irrespectively of the logic state assumed by this output at the previous reading.

During the reading phase, the follower amplifier is deactivated (output at high impedance). The application of a reading voltage to a word line has two possible effects:

(1) if the read cell is a blank cell, then it tends to discharge the bit line with a current i. But the mirror current dictates a current ki (with k smaller than 1) in the bit line, since simultaneously a current i flows in the reference line. The drain of the transistor T1 tends to fall to a zero potential while the drain of the transistor T2 remains at about the level of a threshold voltage below the supply voltage Vcc. The differential amplifier AD switches over to a first state;

(2) if the read cell is programmed, it does not let through any bit line discharging current, while the copying transistor T3 tends to dictate a discharge current ki. The transistor T3 gets saturated and tends to raise the drain potential of T1 to Vcc. The differential amplifier AD switches over to the other direction.

In a second embodiment, which can be seen in FIG. 3, an additional transistor T6 is interposed between the drain of the precharging transistor T1 and the drain of the copying transistor T3; and similarly, a transistor T7 is interposed between the drain of the precharging transistor T2 and the drain of the reference transistor T4.

These transistors are cascode-connected, i.e. they have their gate at a constant potential that makes them conductive. Preferably, they are P channel transistors, the gate of which is at the low potential of the supply of the circuit (ground terminal B). The output of the follower amplifier AD is connected to the junction point of the precharging transistor T1 and the additional transistor T6.

The advantage of these transistors is that they introduce a high resistive impedance in dynamic mode between the bit line and the inputs of the differential amplifier. This impedance sets up a decoupling between the drain of the transistor T1 (having a high parasitic capacitance because of the presence of the follower amplifier) and the input of the differential amplifier (having a low parasitic capacitance).

The result thereof is that the disequilibrium of voltages that appears on the bit line during the reading phase gets retransmitted in a highly amplified state to the terminals of the differential amplifier. The reading is therefore accelerated.

What is claimed is:

1. A memory in integrated circuit form, comprising: at least one bit line to which memory cells are connected, and a reading circuit including:

a differential amplifier connected to said bit line for determining a state of at least one memory cell connected to said bit line during a reading phase, means for precharging the bit line during a precharging phase before the reading phase, and balancing means for balancing of input potentials of the differential amplifier during a balancing phase after said precharging phase and before the reading phase, the balancing means including a follower amplifier, an input of the follower amplifier being connected to an output of the differential amplifier and an output of said follower amplifier being connected to the bit line in such a way that, during the balancing phase, the follower amplifier injects a load current into the bit line in a direction substantially cancelling the output voltage of the differential amplifier.

2. A memory according to claim 1, further comprising:
a reference line,
a first precharging transistor connected to said bit line between said memory cells and said differential amplifier,
a second precharging transistor connected to said reference line and said differential amplifier,
wherein the output of the follower amplifier is connected during the balancing phase to the first precharging transistor.

3. A memory according to claim 2, wherein the first and second precharging transistors each has its gate connected to a reference potential during the precharging phase.

4. A memory according to claim 2, wherein the bit line and the reference line are connected to current comparison means enabling a comparison, during the reading phase, of a bit line discharging current and a reference line discharging current.

5. A memory according to claim 4, wherein the comparison means includes a reference transistor connected to the reference line through the second precharging transistor and a copying transistor connected to the bit line through the first precharging transistor for copying the current of the reference transistor.

6. A memory according to claim 5, wherein a first intermediate transistor having its gate connected to a fixed potential is series connected between the copying transistor and the first precharging transistor.

7. A memory according to claim 6, wherein the first intermediate transistor is a P-channel transistor and has its gate connected to said fixed potential which is a low supply potential.

8. A memory according to claim 6, wherein a second intermediate transistor, having its gate connected to the same fixed potential as the first intermediate transistor, is series connected between the reference transistor and the second precharging transistor.

9. A method for reading a memory cell connected to a bit line of a memory in integrated circuit form, said method comprising the steps of:

precharging said bit line and a reference line;

determining a state of said bit line, during a reading phase, based upon the output of a differential amplifier connected to said bit line and said reference line; and connecting the output of said differential amplifier to said bit line, during a balancing phase prior to said reading phase, such that the output of said differential amplifier is substantially cancelled.

10. The method of claim 9, wherein said connecting step includes the steps of:

connecting an input of a follower amplifier to the output of said differential amplifier, and connecting an output of said follower amplifier to said bit line.

11. The method of claim 9, wherein said precharging step includes the steps of:

connecting said bit line to a first precharging transistor;

connecting said reference line to a second precharging transistor; and connecting a gate of said first precharging transistor and a gate of said second precharging transistor to a fixed reference potential.

* * * * *